United States Patent [19]
Hilbe

[11] Patent Number: 5,818,672
[45] Date of Patent: Oct. 6, 1998

[54] GROUND LOOP CURRENT SUPPRESSOR

[76] Inventor: Thomas C. Hilbe, P.O. Box 1606, Cambria, Calif. 93428

[21] Appl. No.: 917,118
[22] Filed: Aug. 25, 1997
[51] Int. Cl.$^6$ .................................................... H02H 9/08
[52] U.S. Cl. .............................. 361/43; 361/58; 361/111; 361/118
[58] Field of Search ................................. 361/111, 118, 361/119, 43, 58, 42, 48; 307/327, 147, 149

[56] References Cited

U.S. PATENT DOCUMENTS

| 4,573,098 | 2/1986 | Williston | 361/42 |
| 4,703,195 | 10/1987 | Bailey | 361/48 |
| 5,170,081 | 12/1992 | Adachi | 327/560 |
| 5,321,318 | 6/1994 | Montreuil | 361/42 |

Primary Examiner—Jeffrey A. Gaffin
Assistant Examiner—Stephen W. Jackson
Attorney, Agent, or Firm—J. E. McTaggart

[57] ABSTRACT

Apparatus and process are provided for suppressing interference caused by ground loop currents associated with two A.C. power-line operated electrical/electronic equipment units, such as an audio source and an amplifier, where typically the ground loop includes a shielded signal cable interconnecting the two equipment units. A signal representing current sensed from a selected region of the ground loop is amplified and injected into a second region of the ground loop as a counteractive current having polarity opposite that of the original ground loop current, thus tending to nullify the interference. The amplification may be made adjustable for optimal suppression. Ground loop current may be sensed by a sensing transformer coupled to the loop or by a pair of sense lines, connected to selected nodes in the ground loop such as respective ground terminals of the two equipment units, and providing the sensed signal to differential amplifier inputs. A counteractive current, delivered by the amplifier output, is coupled to the ground loop inductively by means of a driving transformer having a closed ferromagnetic core surrounding the selected portion of the ground loop, such as the grounding conductor of a line cord of one of the equipment units or the shielded signal cable interconnecting the two equipment units.

18 Claims, 4 Drawing Sheets

GROUND LOOP CURRENT SUPPRESSOR

FIELD OF THE INVENTION

The present invention relates to the field of electronic equipment operated from A.C. power lines and more particularly it relates to suppression of unwanted interference in such equipment originating from unwanted ground loop currents.

BACKGROUND OF THE INVENTION

Ground loop pickup has long been a source of harmful hum and noise interference in sensitive A.C. power-line operated electronic equipment, including computers, communications equipment and audio equipment, particularly high gain amplifiers. The most common, least avoidable cause is the powering of equipment from different locations that do not have the same potential on the equipment grounding conductor or "green wire". This can be due to various causes including current from leakage resistances, stray capacitance or mutual inductance linking the equipment ground and the "hot" wires, line noise filters that direct currents into the "green wire", etc., particularly with two (or more) pieces of equipment grounded to different potentials. The ground referenced signal cable between then completes the loop creating a closed ground circuit in which current flows. A portion of this current develops an interference voltage that adds onto the signal being transferred resulting in undesirable hum, noise, etc.

In 1990 section 250-21(d) was added to the National Electrical Code to prohibit the removal of the equipment ground; this was in response to a common practice of "lifting" a ground to break a loop to reduce ground loop current.

In view of this prohibition, another remedial practice that has been commonly attempted in balanced audio signal cable interconnections involves disconnecting one end of the shield of the signal cable in order to break the loop at that point. While this may solve the hum and noise problem it has been found to increase susceptability to R.F. (radio frequency) and often results in spurious reception of a local radio station or other transmitter. Such "shield clipping" cannot be used with unbalanced signals, e.g. video and some computer networks, since they rely on the shield as a necessary part of the signal path. In the case of computer networks, one solution involves rewiring the power system by running a separate equipment ground wire back to a common source ground terminal: while this is often successful for computers and video equipment, it requires costly rewiring for adding or relocating equipment. In video systems the need for such rewiring may be avoided by the use of expensive special stabilizing drivers and receivers, for each video signal.

DISCUSSION OF KNOWN ART

U.S. Pat. No. 5,321,318 to Montreuil discloses a method and device for neutralizing stray current with regard to animal protection, by injecting a compensatory current directly into the circuit.

U.S. Pat. No. 5,170,081 to Adachi et al is directed to suppressing induced noise by preventing loop currents in multiple transmission cables having a common ground at the input end by isolating output ends to independently feed corresponding amplifiers each provided with discrete input ground terminals.

U.S. Pat. No. 4,703,195 to Bailey discloses a parallel grounding scheme for card cage electronic modules using two system grounding paths to minimize noise.

U.S. Pat. No. 4,573,098 to Williston discloses ground voltage suppression utilizing a saturating inductor or like non-linear impedance device connected directly between a neutral conductor and a ground conductor.

OBJECTS OF THE INVENTION

It is a primary object of the present invention to provide apparatus and methods for suppressing ground loop current associated with power-line-operated electronic equipment so as to avoid interference arising from the ground loop current.

It is a further object to provide apparatus and methods for suppressing the ground loop current in existing systems in a manner that does not require disconnecting, rewiring or altering the equipment or associated ground wiring, cabling or shielding.

It is a further object to provide the apparatus and methods for suppressing ground loop current that can be applied externally to a three wire power cable, i.e. a power line cord or cable having a hot, a neutral and a ground wire.

It is a further object to provide the apparatus and methods for suppressing ground loop current that can be applied externally to a multi-conductor cable that includes one or more power conductors, ground conductors, signal cables and/or cable shields.

SUMMARY OF THE INVENTION

The abovementioned objects have been accomplished by utilizing the principle of sensing current flowing in a first selected portion of the ground loop and inductively coupling a counter-active current, derived from the sensed current, into a second selected portion of the ground loop in a manner that acts to counteract the original ground loop current. A signal representing sensed ground loop current is amplified and, in a preferred embodiment, applied to a coil winding of a coupling transformer having a closed ferromagnetic core with a window that is made to surround a selected portion of wiring within the ground loop and thus couple a counteractive current back into the ground loop.

BRIEF DESCRIPTION OF THE DRAWINGS

The above and further objects, features and advantages of the present invention will be more fully understood from the following description taken with the accompanying schematic block diagrams in which.

DETAILED DESCRIPTION

Figure 1:
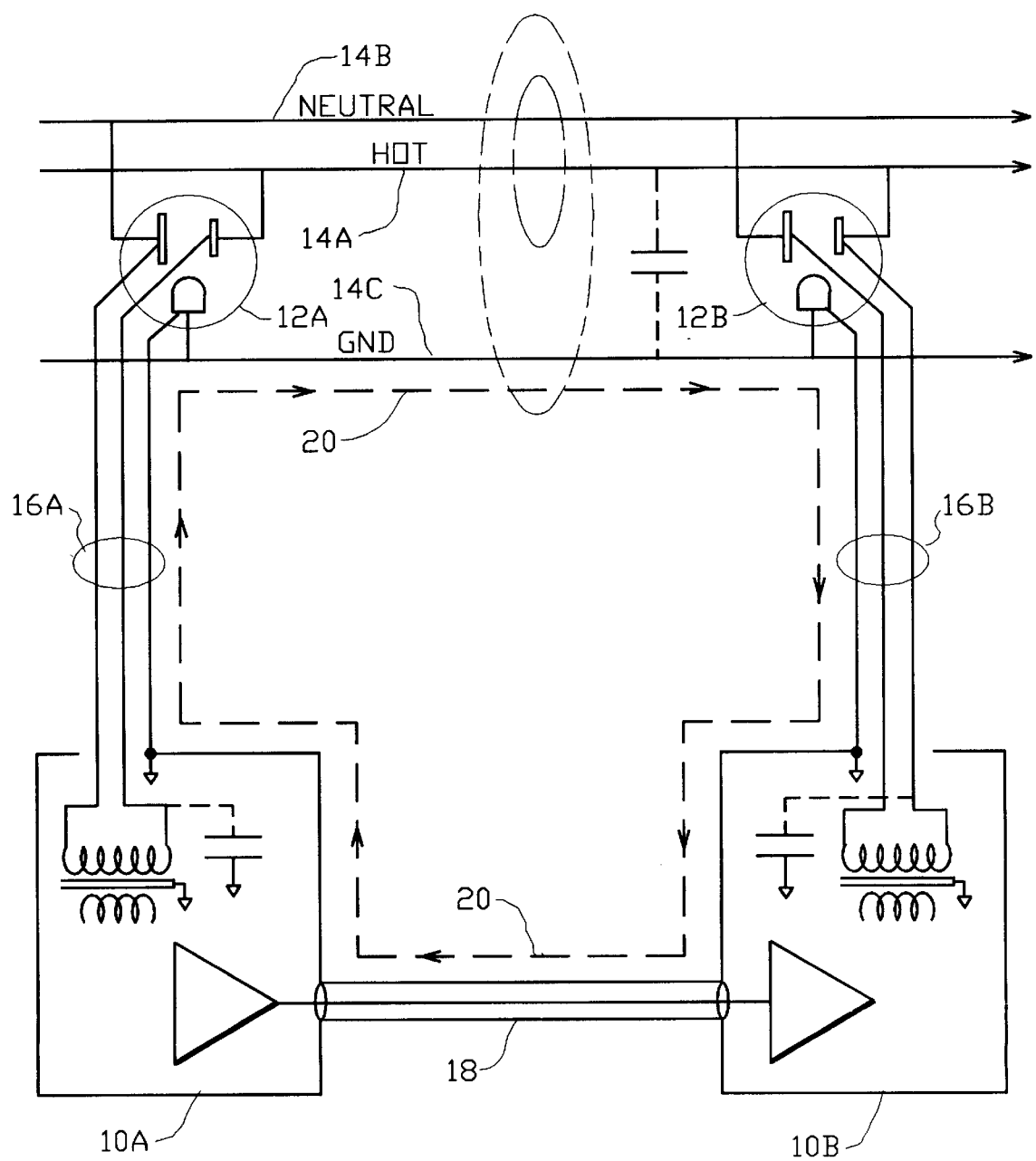
FIG. 1 illustrates a typical ground loop formed by two A.C. power-operated electronic equipment units.

FIG. 1 shows a typical hookup of two electrical/electronic equipment units 10A and 10B and illustrates a ground loop current path that is likely to occur in such a hookup. Standard 3-conductor power outlets 12A and 12B are connected at different points along a branch of an A.C. power line having the standard three-wire configuration having "hot", neutral and grounding conductors 14A, 14B and 14C respectively as shown. Plugged into outlets 12A and 12B are 3-wire line cords 16A and 16B respectively, powering the equipment units 10A and 10B, typically an audio source and an audio amplifier interconnected through shielded signal cable 18 as shown. The path of a ground loop 20 formed by this configuration is indicated by the dashed line; ground current will flow around the loop 20 as indicated as a result of current induced into any portion of the loop. In this instance ground currents can originate from inherent capacitive and/or inductive coupling between the grounding conductor 14C and the hot/neutral conductors 14A/14B as indicated, as well as from resistive fault leakage such as from wet dirty power line insulators. Another source of ground loop current is primary-to-ground leakage current through capacitive and/or resistive leakage paths in any other nearby equipment connected to the power line and more particularly such leakage paths in the subject equipment units 10A and 10B as indicated.

These unwanted currents become converted to unwanted voltages by ohmic resistance or impedance values along various portions of the ground current path: such unwanted voltages appearing across signal cable 18 can result in interference reaching the input of equipment unit 10B. Such interference can reach intolerable levels in various kinds of systems such as communications systems, video systems, computers and other digital systems, and is particularly troublesome in high powered high gain audio amplifier systems, where it is typically manifested as hum or buzz with a strong component at the powerline frequency, e.g. 60 Hz, and harmonics thereof.

Many corrective expedients have been tried in efforts to alleviate such ground loop interference; it is often addressed empirically in an installed system, leading to one-of-a-kind solutions. One type of remedy involves open-circuiting the ground loop at some point, thus reducing the ground loop current and associated interference voltages, for example "lifting" the green grounding wire of the power cord 16A or 16B of either equipment unit 10A or 10B. Defeating the intended grounding wire in this manner is both potentially dangerous and illegal.

"Lifting" the ground connection at either end of signal cable 18 to open the ground loop may help, but renders the system vulnerable to unwanted pickup of radio signals from nearby transmitters.

Figure 2:
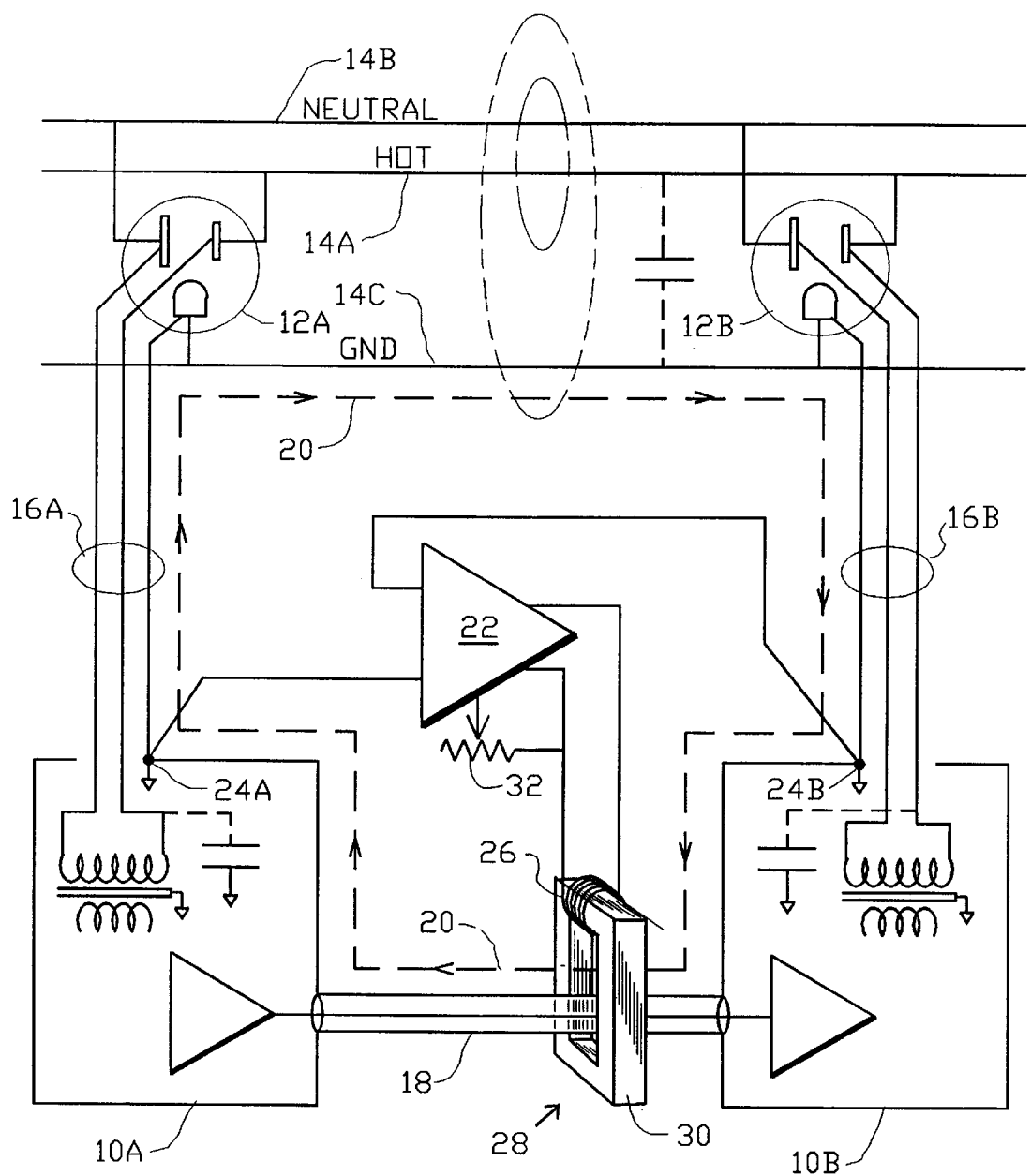
FIG. 2 illustrates the principle of the present invention in an embodiment applied in a first manner to the ground loop of FIG.

FIG. 2 shows the elements of the present invention applied to a system with a ground loop 20 such as that in FIG. 1. An amplifier 22 has a differential input with two sense lines connected to selected points in the ground loop 20: in this instance ground terminal 24A of equipment 10A and ground terminal 24B of equipment 10B. Amplifier 22 includes a driver amplifier which drives the primary coil winding 26 of a coupling transformer 28 which has a closed loop ferromagnetic core 30, providing an open window as shown, typically stacked from transformer-grade iron laminations. Signal cable 18, passing through the window of core 30 as shown, acts as a one-turn secondary winding tightly coupled inductively to primary winding 26.

Ground current I in loop 20 is sensed as a signal voltage I*Z appearing between the two ground terminals 24A and 24B due to circuit impedance Z in the portion of the loop 20 between these points. The sensed signal voltage is amplified in amplifier 22 and delivered to the primary winding 26 of transformer 28, which acts as a current transformer injecting a stepped-up counteractive current back into loop 20.

The overall polarity of the pickup means, amplifier 22 and coupling transformer 28 is made such that the induced current in cable 18 counteracts the original ground current in loop 20 and thus acts to reduce the effective ground loop current and suppress related interference effects.

Amplifier 22 is preferably equipped with a gain control 32 that enables adjustment for optimal suppression of ground loop current. Generally the gain will be set to a maximum usable gain that is limited by a threshold of instability, allowing a working margin of stability. Further refinements to increase the noise suppression through increased gain could include additional circuitry and/or adjustment controls relating to frequency and phase equalization to increase the usable gain capability.

Figure 3:
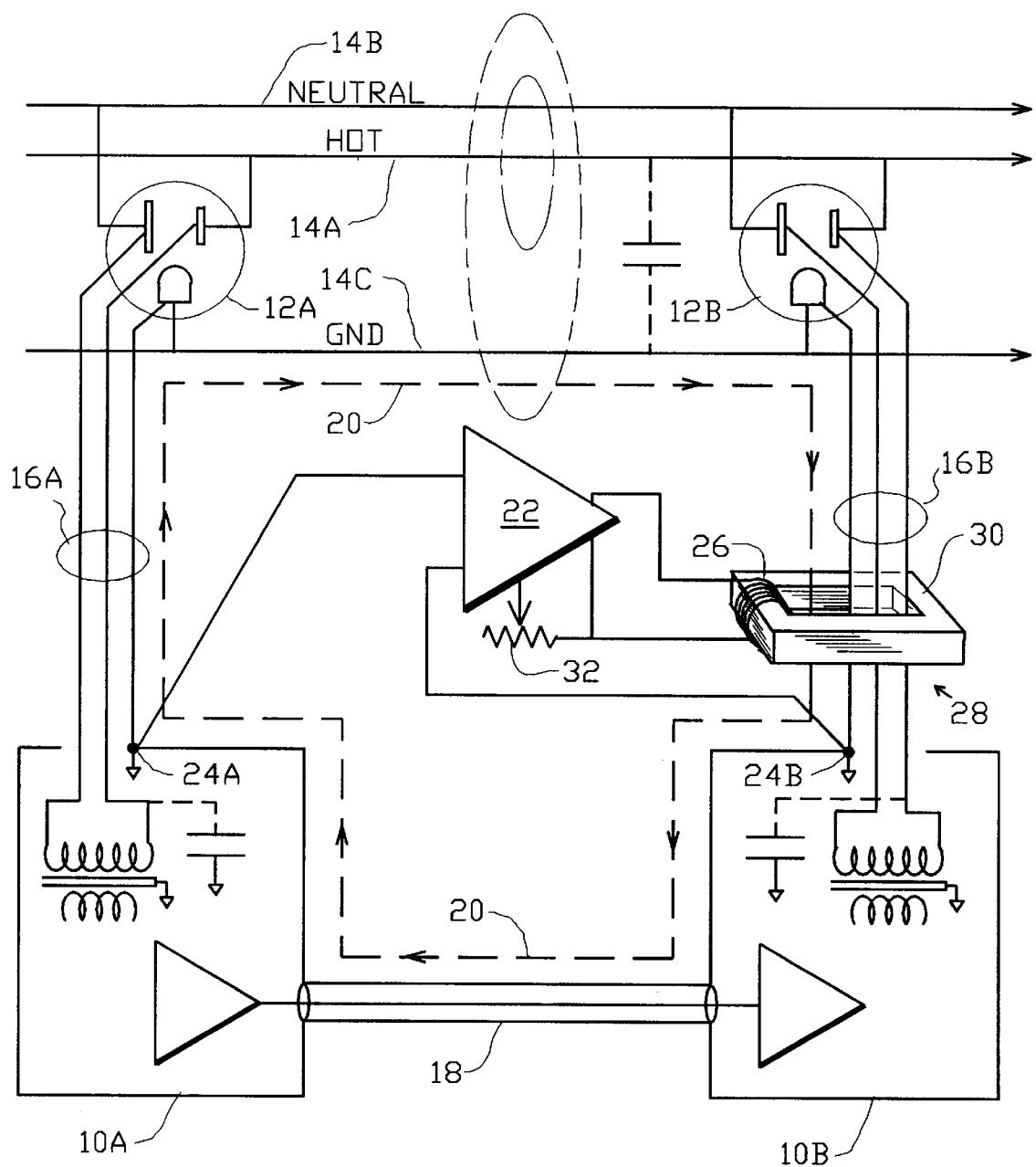
FIG. 3 shows an embodiment similar to that of FIG. 2 applied in a second manner to the ground loop.

FIG. 3 shows the same elements and the same sensing arrangement as FIG. 2; however the region of deployment of coupling transformer 28 has been moved and is now deployed in a different selected region of the ground loop 20. The three-wire power line cord 16B of equipment 10B is directed through the window of core 30, causing the counteractive current to be inductively injected into the portion of loop 20 formed by the (green) ground conductor of line cord 16B, thus acting to nullify or at least suppress the ground loop current and its interference effects.

The inclusion of the neutral and hot power supply lines of the line cord 16B in the window of the transformer 28 is optional: any small amount of current induced into these lines transformer 28 has no significant effect. Essentially the core window needs to surround only one wire of line cord 16B: the ground conductor carrying the ground loop current Instead of sensing ground loop current with the pair of sense lines connected to points in the loop 20 as shown in FIGS. 2 and 3, other means known in the art can achieve the same end result, e.g. inductive coupling using an input coupling transformer similar to the output coupling transformer 28 described above in connection with FIGS. 2 and 3, with its core window surrounding a conductor carrying loop current at a selected sensing region of the loop.

Figure 4:
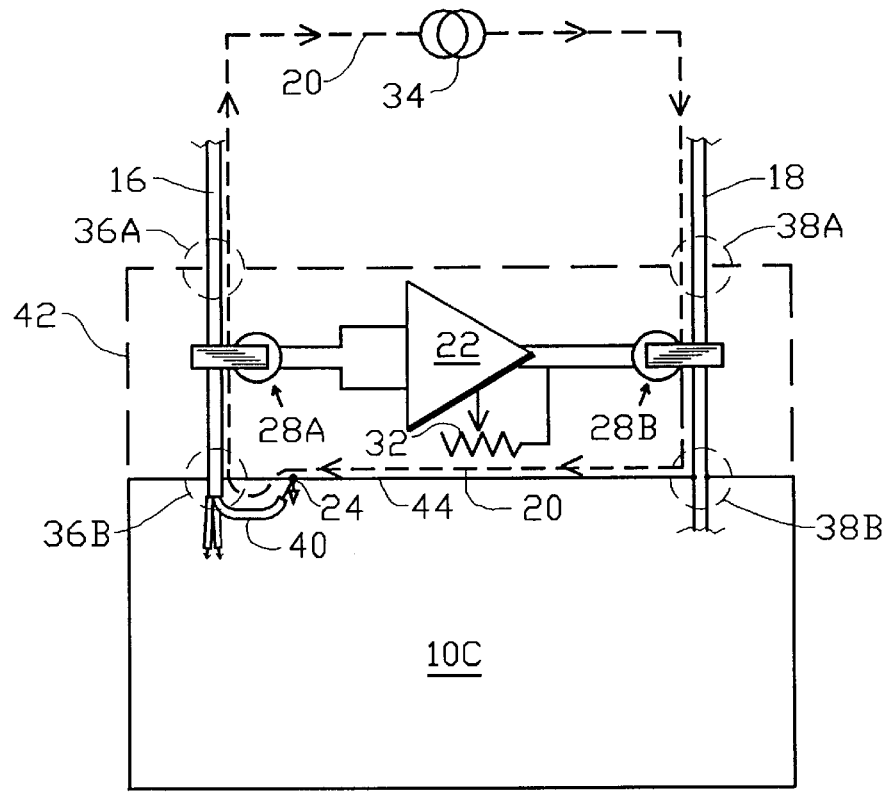
FIG. 4 shows an embodiment of the present invention as applied to a single equipment unit.

FIG. 4 illustrates the present invention operative combined with an original equipment unit 10C having a three-wire power line cord 16 and a shielded signal cable 18 each forming a series branch of a ground loop 20 carrying a flow of unwanted ground current symbolized by a current generator 34.

Line cord 16 passes through the core window of sensing transformer 28A; the end portion 40 of grounding conductor of line cord 16 is connected to a ground terminal 24 on the common ground plane 44 formed by the metal enclosure of equipment unit 10C. A power line connector such as a standard plug and socket may be installed in the line cord at location 36A or 36B.

An auxiliary enclosure 42, enclosing the elements of the invention, is optional, and may be made from metal or non-conductive material such as plastic.

Shielded signal cable 18 passes through the core window of driving transformer 26B; the shield conductor is attached at or near its end to the ground plane 44, a portion of which may be utilized in some instances to conduct the ground current in loop 20 to ground terminal 24. A signal cable connector, such as a standard shielded plug and socket, may be installed in the signal cable 18 at location 38A or 38B.

To maximize transformer coupling, leakage of ground loop current past the transformer should be minimized, i.e. the percentage of the total current directed through the core window(s) should be kept as high as possible. Therefore, in the regions of line cord 16 and signal cable 18 within and above the transformers 28A and 28B as shown, including any connector means provided at locations 36A and 38A, the respective ground current conductors should be "floating", i.e. insulated from contact with the common ground plane 44 or any surrounding metal parts.

Amplifier 22, with gain control 32, is shown receiving input from the coil of sensing transformer 28A and delivering its output to the coil of the driving transformer 28B. Transformers 28A and 28B could be interchanged with regard to their location in loop 20 or could be deployed at other selected sensing/driving regions in loop 20.

Figure 5:
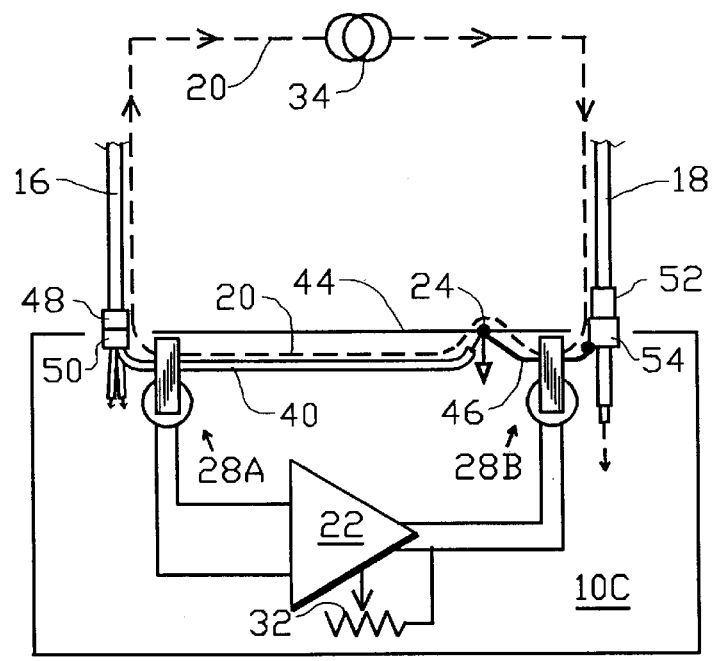
FIG. 5 shows an embodiment of the present invention as incorporated internally in a single equipment unit.

FIG. 5 illustrates an embodiment of the present invention incorporated into an equipment unit 10C. Transformers 28A and 28B, incorporated into equipment unit 10C along with amplifier 22, can be made substantially smaller than if required to surround a much larger line cord, shielded cable or connector. The sensing transformer 28A may be made smaller than the driving transformer 28B which must handle a higher power level.

The grounding conductor 40 of the power line cord 16, conducting ground current of loop 20, is directed through the core window of sensing transformer 28A to ground terminal 24 on the ground plane 44 of equipment unit 10C. A short ground strap 46 from shielded cable receptacle 54, connected to shielded cable 18 via mating connector pair 52 and 54, conducts ground loop current through the core window of transformer 28B to ground terminal 24.

Connector elements 48, 50, 52 and 54 are "floated" so as to keep the ground current conductors insulated from any contact with the common ground plane 44 and thus direct the ground currents through the respective transformer windows.

Sensing transformer 28A and/or driving transformer 28B could alternatively utilize a toroidal core, i.e. a circular core, in place of the rectangular shape shown.

Sensing transformer 28A could be eliminated, and sensing could be implemented by two sense lines in the manner shown in FIGS. 2 and 3, typically with one sense line connected to ground terminal 24 and the other directed externally for connection to a selected node in loop 20, typically the ground terminal of another equipment unit involved in the ground current loop 20.

In addition to the arrangements described above, the invention can be practiced with the current sensing and counteractive current injection deployed at other locations almost anywhere within the ground loop 20. These deployment locations are best determined from a study of the actual path of ground loop current flow in a particular real situation; generally there is a choice of viable deployment locations that are preferred for practical reasons of convenience, from which a final selection may be made empirically.

In non-dedicated embodiments of the invention as directed to after-market retrofit, trial, demonstration or experimental purposes, the amplifier, sensing means and counteractive current injecting transformer may be packaged as a separate equipment unit. For the convenience of avoiding disconnection or disassembly of host equipment, the core windows(s) may be made large enough for passage of connectors, plugs, etc., assembled on the ends of line cords and shielded cables; alternatively the transformer core(s) could be made with a hinged segment that can be opened to receive a grounding conductor, line cord or signal cable in the manner of well known clamp-on ammeters.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A device for suppressing interference from unwanted A.C. power-line-related current in a ground loop, the device comprising:

current-sensing means providing a sensed signal representing ground current flowing in a designated sensed region of the ground loop;

an electronic amplifier receiving the sensed signal as input, and providing as output an amplified sensed signal; and current-driving means coupling the amplified sensed signal from said amplifier into the ground loop in a designated driven region thereof as a counteractive current opposing the unwanted ground loop current, thus tending to suppress the interference.

2. The interference suppressing device as defined in claim 1 wherein said current-driving means comprises a driving transformer having a closed ferro-magnetic core defining a window and having a primary winding receiving the amplified sensed signal, the window surrounding a ground current conductor at the designated driven region of the ground loop so as to couple the amplified sensed signal in the primary winding to the conductor as the counteractive current opposing the unwanted ground loop current.

3. The interference suppressing device as defined in claim 2 wherein said current-sensing means comprises a sensing transformer having a closed ferro-magnetic core defining a window and having a secondary winding, the window surrounding a ground current conductor at the designated driven region of the ground loop, the current conductor thus acting as a single turn primary winding of the sensing transformer, the secondary winding being connected to said amplifier so as to provide input thereto, whereby current in the ground conductor is applied as the sensed signal input to said amplifier.

4. The interference suppressing device as defined in claim 3, incorporated into a first A.C. power-line-operated equipment unit in an electronic system that includes a second A.C. power-line-operated equipment unit, said device further comprising;

a line cord of said first equipment unit, supplying A.C. power thereto from a main A.C. power source, including an equipment grounding conductor connected between a ground node of said first equipment unit and ground means of the power source; and a line cord of said second equipment unit, supplying A.C. power thereto from a main A.C. power source, including an equipment grounding conductor connected between a ground node of said second equipment unit and ground means of the power source;

a signal cable including a signal cable ground conductor having a first end thereof conductively connected to the ground node of the first equipment unit and a second end conductively connected to the ground node of the second equipment unit;

whereby the first equipment grounding conductor, the second equipment grounding conductor and the signal cable ground conductor constitute series-connected branches in the ground current loop.

5. The interference suppressing device as defined in claim 4 wherein:

the sensing region is located along said signal cable ground conductor; and the driving region is located along the grounding conductor of the first equipment unit.

6. The interference suppressing device as defined in claim 4 wherein:

the sensing region is located near the first end of the line cord grounding conductor adjacent the ground plane; and the driving region is located near the first end of the signal cable ground conductor adjacent the ground plane.

7. The interference suppressing device as defined in claim 4 wherein said first equipment unit comprises a housing enclosing said sensing transformer, said amplifier and said driving transformer.

8. The interference suppressing device as defined in claim 1 wherein said electronic amplifier comprises a first and second differential input connected respectively to a first sensed node and second sensed node in the ground loop, the nodes defining the designated the designated sensed region thereof.

9. The interference suppressing device as defined in claim 8, operationally connected to an electronic equipment system comprising:

a first A.C. line-powered electronic equipment unit having a ground terminal defining the first sensed node;

a second AC-line-powered electronic equipment unit having a ground terminal defining the second sensed node;

a shielded signal cable conductively connected between the ground terminal of said first equipment unit and the ground terminal of said second equipment unit;

a first grounding conductor conductively connected between the ground terminal of said first equipment unit and external A.C. power system ground means, and a second grounding conductor conductively connected between the ground terminal of said second equipment unit and the external A.C. power system ground means.

10. The interference suppressing device as defined in claim 9 wherein the designated driven region of the ground loop is located in a predetermined portion of said shielded signal cable.

11. The interference suppressing device as defined in claim 9 wherein the designated driven region is located in a predetermined portion of one of said grounding conductors.

12. The interference suppressing device as defined in claim 8, incorporated into a first A.C. power-line-operated equipment unit in an electronic system comprising;

a line cord of said first equipment unit, supplying A.C. power thereto from a main A.C. power source, said line cord including a grounding conductor having a first end conductively connected to a ground node of said first equipment unit and a second end connected to ground means of the power source; and a second equipment unit having a ground node and having a grounding conductor connected between the ground node and the ground means of the power source;

a signal cable including a ground conductor with a first end thereof conductively connected to the ground node of said first equipment unit and a second end connected conductively to the ground node of said second equipment unit;

whereby the grounding conductor of said first equipment unit, the grounding conductor of said second equipment unit, and the signal cable ground conductor constitute series-connected branches in the ground current loop.

13. The interference suppressing device as defined in claim 12 wherein the first sensed node is the ground node of said first equipment unit and the second sensed node is the ground node of said second equipment unit.

14. The interference suppressing device as defined in claim 13 wherein the driven region is located in the signal cable ground.

15. The interference suppressing device as defined in claim 13 wherein the driven region is located along a portion of the grounding conductor of said first equipment unit.

16. The interference suppressing device as defined in claim 13 wherein the driven region is located along a portion of the grounding conductor of said second equipment unit.

17. The interference suppressing device as defined in claim 13 wherein said first equipment unit comprises a housing enclosing said sensing means, said amplifier and said driving transformer.

18. An electrical process for suppressing interference from unwanted A.C. power-line-related current in a ground loop, comprising the steps of;

(1) sensing the unwanted ground current at a designated sensed region of the loop with sensing means providing therefrom a sensed signal;

(2) amplifying the sensed signal in an electronic amplifier so as to provide an amplified sensed signal; and (3) coupling the amplified sensed signal to a designated driven region of the loop by inductive driving means in a manner to induce a counteractive current into the loop in opposition to the unwanted ground current.

* * * * *